United States Patent [19]

Ohsawa

[11] Patent Number: 4,843,257
[45] Date of Patent: Jun. 27, 1989

[54] REGULATED POWER SUPPLY FOR MOS TRANSISTORS WITH SHORT CHANNEL LENGTH

[75] Inventor: Takashi Ohsawa, Yokohama, Japan

[73] Assignee: Kabushiki Kaisha Toshiba, Kawasaki, Japan

[21] Appl. No.: 243,140

[22] Filed: Sep. 9, 1988

Related U.S. Application Data

[63] Continuation of Ser. No. 104,588, Sep. 29, 1987, abandoned, which is a continuation of Ser. No. 694,819, Jan. 25, 1985, abandoned.

[30] Foreign Application Priority Data

Jan. 26, 1984 [JP] Japan .................. 59-12618

[51] Int. Cl.$^4$ .......................... H03K 3/01; H03F 3/16
[52] U.S. Cl. .................. 307/296.8; 307/304; 307/497
[58] Field of Search ............ 307/296 R, 297, 304, 307/491, 494, 497, 546, 548

[56] References Cited

U.S. PATENT DOCUMENTS

| | | | |
|---|---|---|---|
| 4,042,843 | 8/1977 | Sikes | 307/297 |
| 4,300,061 | 11/1981 | Mihalich et al. | 307/297 |
| 4,309,627 | 1/1982 | Tabata | 307/362 |
| 4,318,040 | 3/1982 | Hilbourne | 307/304 |

FOREIGN PATENT DOCUMENTS 0063483 10/1972 European Pat. Off.
0113458 7/1984 European Pat. Off.

Primary Examiner—Stanley D. Miller
Assistant Examiner—Richard Roseen
Attorney, Agent, or Firm—Finnegan, Henderson, Farabow, Garrett, & Dunner

[57] ABSTRACT

This semiconductor device has power source terminals for receiving a power source voltage and a voltage converting circuit for generating an output voltage lower than the power source voltage on a semiconductor chip. In particular, the voltage converting circuit has a constant voltage circuit for generating a reference voltage lower than the power source voltage, a voltage drop circuit which is connected to the power source terminal, and a differential amplifying circuit for controlling the conductivity of the voltage drop circuit in accordance with a difference between the output voltage of the voltage drop circuit and the reference voltage from the constant voltage circuit. This differential amplifying circuit generates a control voltage which linearly varies at a gentle slope in response to a change in feedback voltage near the reference voltage.

11 Claims, 2 Drawing Sheets

FIG. 3
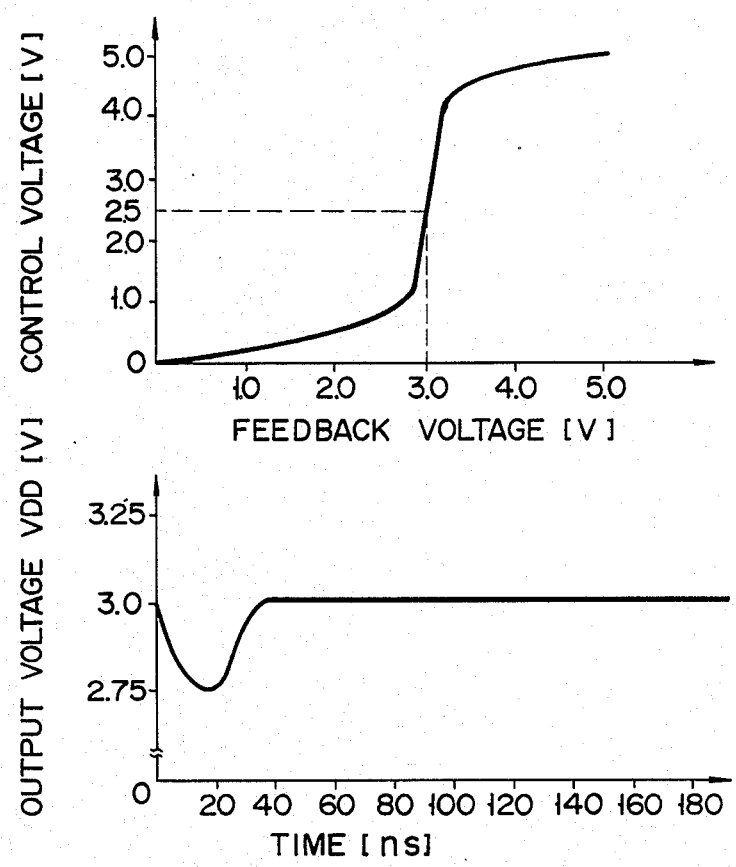
FIG. 4
FIG. 5
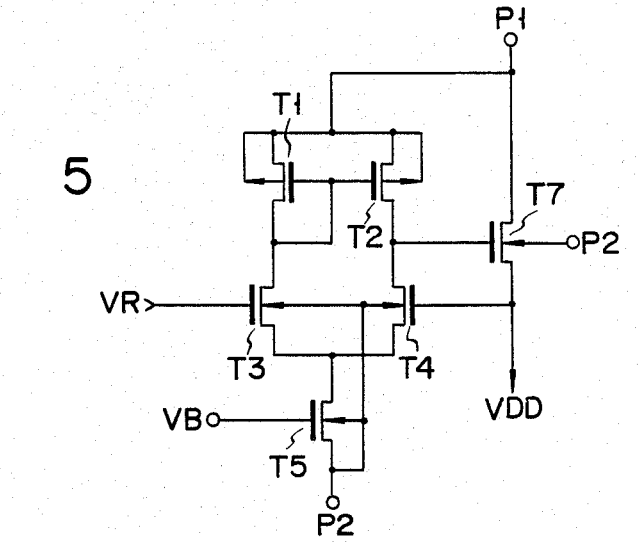

REGULATED POWER SUPPLY FOR MOS TRANSISTORS WITH SHORT CHANNEL LENGTH

This application is a continuation of application Ser. No. 104,588, filed Sept. 29, 1987, which in turn is a continuation of Ser. No. 694,819, filed Jan. 25, 1985.

BACKGROUND OF THE INVENTION

The present invention relates to a semiconductor device and, more particularly, to a semiconductor device having a voltage converting circuit to supply power to insulated gate MOS transistors each of which has a very short effective channel length.

Recently, manufacturing technology for MOS LSIs has developed remarkably so that very small MOS transistors can be formed on a semiconductor chip with high integration. A very large scale integrated circuit (i.e., VLSI) having tens of thousands of MOS transistors, each having an effective channel length of about 1.5 $\mu$m, has already been developed. It is believed that a MOS transistor having an effective channel length of less than 1 $\mu$m will be formed on a semiconductor chip in the future.

In the case of increasing the degree of integration of a MOS LSI circuit without changing the operation voltage, as the effective channel length of a MOS transistor is reduced, the electric field in the MOS transistor generally increases and, thus, is larger than that before such a reduction. The following phenomena are induced due to this increase in the electric field and become obstacles, particularly in the development of an MOS LSI circuit having submicron MOS transistors (that is, MOS transistors having effective channel lengths less than 1 $\mu$m). These phenomena include:

1. Generation of hot electron or hot hole due to impact ionization.
2. Increase in substrate current.
3. Punch through.
4. Change in threshold voltage with the elapse of time that is caused since a gate insulation film traps the hot carrier and the like.

Especially, the time-change of the threshold voltage shown in the fourth item largely affects the performance and reliability of a MOS transistor.

As countermeasures to these phenomena, it is important to prevent the occurrence of a high electric field in the channel on the drain side. For example, use of Lightly Doped Drain (LDD) transistor technology can be considered whereby the drain of the MOS transistor is formed at a low density. Although this low-density drain can reduce the electric field in the channel, the conductance of the MOS transistor will decrease due to this type drain. In the case where a smallest MOS transistor than the current MOS transistor is desired, this reduction of conductance cannot be ignored. Additionally, the transistor's manufacturing process becomes difficult. Therefore, the usefulness of such a countermeasure will become less in the future, although this method is presently being used.

As another countermeasure the operating voltage of the MOS transistor can be set to a low value. However, this counter-measure can be impractical since a submicron MOS LSI circuit has not come into wide use yet. For instance, in the case where the MOS LSI circuit is one of the circuit parts of a computer system, the MOS LSI circuit is ordinarily operatively connected to other circuit parts, e.g., TTL devices on a printed circuit board. Therefore, to realize miniaturization and cost reduction of a computer system, it is desired that electricity be commonly supplied from a single power source to these circuit parts. If the operating voltage of the MOS LSI circuit is lower than those of other circuit parts, the computer system will need an additional power source for the MOS LSI circuit. Since, in current computer systems, the operating voltage (i.e., 5 V) of the TTL device has been adopted as the standard power source voltages, it is desired that the MOS LSI circuit operate at 5 V irrespective of the effective channel length of the MOS transistors.

SUMMARY OF THE INVENTION

It is an object of the present invention to provide a semiconductor device having a voltage converting circuit which can convert a power source voltage that is supplied to a semiconductor chip from the outside to a voltage at which an MOS transistor having a very short effective channel length can stably operate.

According to the present invention, there is provided a semiconductor device having a voltage converting circuit comprising: first and second power source terminals for receiving a power source voltage; a voltage drop circuit which is connected in series between the first and second power source terminals through a load; a constant voltage generating circuit for generating a reference voltage lower than the power source voltage; and a differential amplifying circuit for gently changing the drop voltage in the voltage drop circuit in response to a change in output voltage of the voltage drop circuit such that the voltage difference between the output voltage of the voltage drop circuit and the reference voltage is reduced.

According to the present invention, even if the output voltage of the voltage drop circuit varies due to, for example, a variation in temperature, power source voltage or the like, the feedback loop in the voltage converting circuit can always return the output voltage to a set voltage. If this set voltage is sufficiently low, a MOS transistor, which is capable of operating at this voltage, can be formed with a sufficiently short effective channel length. Therefore, the obstacle to increasing the integration of a MOS LSI circuit can be reduced.

BRIEF DESCRIPTION OF THE DRAWINGS

FIG. 3 is a graph showing the input/output operation characteristics of the differential amplifying circuit shown in FIG. 2;

FIG. 4 is a graph showing a time-change of an output voltage of the voltage drop circuit shown in FIG. 2; and FIG. 5 shows a part of a voltage converting circuit, which is similar to the voltage converting circuit in FIG. 2, in a MOS LSI device according to another embodiment of the present invention.

DETAILED DESCRIPTION OF THE PREFERRED EMBODIMENTS

A semiconductor device of one embodiment of the present invention will now be described with reference to FIGS. 1 to 4. The MOS LSI device of FIG. 1 has an LSI circuit 10 (serving as, for example, a memory or a data processor) and a voltage converting circuit 12 to supply power to the LSI circuit 10 on the same semiconductor chip 14. Power source terminals P1 and P2 are formed in the outer peripheral portions on the semiconductor chip 14 together with data input and output terminals IN and OUT of the LSI circuit 10. The power source terminals P1 and P2 are connected to an external power source (not shown) for generating a power source voltage VCC, e.g., 5 V, and are set to the potentials of 5 V and 0 V, respectively.

The LSI circuit 10 contains MOS transistors each having a very short (e.g., less than 1 μm) effective channel length and is designed so as to operate at a voltage, e.g., 3 V, which is lower than the power source voltage VCC. The voltage converting circuit 12 is connected to the power source terminals P1 and P2 in order to receive the power source voltage VCC and is also connected to power lines L1 and L2 of the LSI circuit 10 in order to supply an output voltage VDD. The voltage converting circuit 12 includes MOS transistors, each having a sufficiently long effective channel length (e.g., 2 μm or more). In the voltage converting circuit 12, the output voltage VDD is controlled such that it is maintained at an operating voltage (i.e., 3 V) of the LSI circuit 10.

Figure 1:
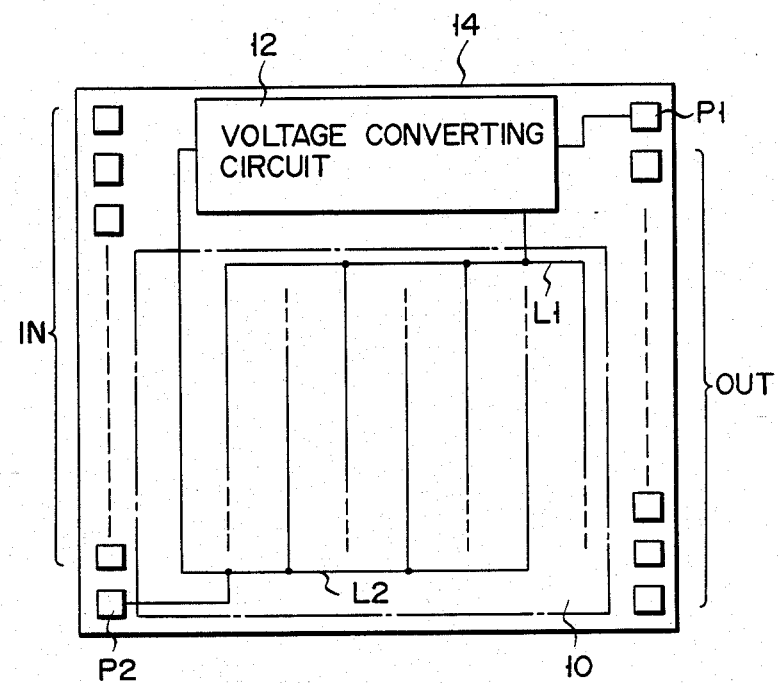
FIG. 1 shows a structure of an MOS LSI device according to an embodiment of the present invention.
Figure 2:
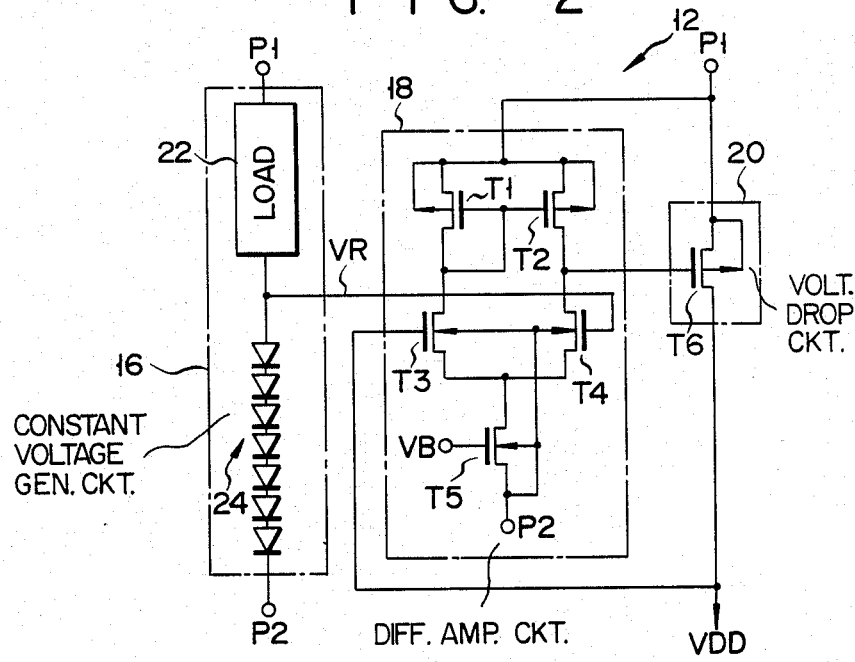
FIG. 2 is a detailed circuit diagram of a voltage converting circuit in the MOS LSI device of FIG. 1.

FIG. 2 shows a detailed structure of the voltage converting circuit 12 shown in FIG. 1. This voltage converting circuit 12 includes a constant voltage generating circuit 16, a differential amplifying circuit 18, and a voltage drop circuit 20. The constant voltage generating circuit 16 is provided to supply a reference voltage VR to the differential amplifying circuit 18. The reference voltage VR is set to a voltage (i.e., 3 V) which is equal to the operating voltage of the LSI circuit 10. The constant voltage generating circuit 16 has a load 22 and a diode series 24. One end of the load 22 is connected to the power source terminal P1. The diode series 24 is connected between the other end of the load 22 and the power source terminal P2 in the forward direction. The differential amplifying circuit 18 has p-channel MOS transistors T1 and T2 as loads, n-channel MOS transistors T3 and T4 as a differential pair, and an n-channel MOS transistor T5 as a constant current source. In the differential amplifying circuit 18, a control voltage to the voltage drop circuit 20 is generated in correspondence to the difference between the gate voltages of the MOS transistors T3 and T4.

A gate of the MOS transistor T3 is connected to an output terminal of the voltage drop circuit in order to receive the output voltage VDD. A gate of the MOS transistor T4 is connected to a junction between the load 22 and the diode series 24 in order to receive the reference voltage VR. A bias voltage VB is supplied to a gate of the MOS transistor T5. When the bias voltage is 5 V, a gate of the MOS transistor T5 is connected to the power source terminal P1. Gates of the MOS transistors T1 and T2 are commonly connected to a drain of the MOS transistor T3. A source of the MOS transistor T5 is connected to the power source terminal P2. A drain of the MOS transistor T5 is connected to the power source terminal P1 through the current path of the MOS transistors T3 and T1 and is also connected to the power source terminal P1 through the current path of the MOS transistors T4 and T2. Substrates of the MOS transistors T1 and T2 are commonly connected to the power source terminal P1. Substrates of the MOS transistors T3, T4 and T5 are commonly connected to the power source terminal P2.

The voltage drop circuit 20 of FIG. 2 has a p-channel MOS transistor T6. A gate of the MOS transistor T6 is connected to a drain of the MOS transistor T4 in order to receive the control voltage. A source and a substrate of the MOS transistor T6 are commonly connected to the power source terminal P1. A drain of the MOS transistor T6 is connected through the power line L1 to the LSI circuit 10 in order to supply the output voltage VDD and is also connected to the gate of the MOS transistor T3. A gate width of the MOS transistor T6 is set to a value wide enough to supply a load current to the LSI circuit 10.

The differential amplifying circuit 18 of FIG. 2 will now be further explained in detail. Channel widths W1, W2, W3 and W4 and channel lengths L1, L2, L3, and L4 of the respective MOS transistors T1, T2, T3, and T4 are set so as to have the following relation:

$$(W1/L1)\cdot(L3/W3) = (W2/L2)\cdot(L4/W4) \qquad (1)$$

FIG. 3 shows the input/output operation characteristics of the differential amplifying circuit 18. Feedback Voltage in FIG. 3 corresponds to the output voltage VDD fed back to the gate of the MOS transistor T3 from a drain of the MOS transistor T6. The differential amplifying circuit 18 generates the control voltage shown in FIG. 3 in response to this feedback voltage. In addition, the control voltage increases or decreases depending on an increase or decrease in the feedback voltage, respectively. In particular, when the feedback voltage is about 3 V, the differential amplifying circuit 18 allows the control voltage to change linearly at a gentle slope, thereby controlling the MOS transistor T6 such that the output voltage VDD is maintained at the operating voltage 3 V of the LSI circuit 10.

The operation of the voltage converting circuit 12 will now be described with reference to FIG. 4. When the power source voltage VCC (=5 V) is supplied between the power source terminals P1 and P2, the output voltage VDD rises and is then stably set at 3 V. Upon an application of this output voltage VDD to the LSI circuit 10, the load current starts flowing to the LSI circuit 10 through the current path of the MOS transistor T6. Immediately after this, the drain voltage (i.e., output voltage VDD) of the MOS transistor T6 drops as shown in FIG. 4 due to the charging of the LSI circuit 10. The output voltage VDD is supplied as the feedback voltage to the gate of the MOS transistor T3. A current corresponding to this feedback voltage flows through the current path of the MOS transistors T1 and T3. Then, a mirror current equal to this current flows through the current path of the MOS transistors T2 and T4. The constant voltage generating circuit 16 supplies the reference voltage VR (=3 V) to the gate of the MOS transistor T4, thereby maintaining the resistance of the current path of the MOS transistor T4 constant. Due to this, the voltage drop at the MOS transistor T4 is proportional to the mirror current. The MOS transistor T6 receives the voltage corresponding to the voltage drop at the MOS transistor T4 as the control voltage.

The relation between the control voltage and the feedback voltage is shown in FIG. 3. Assuming that the feedback voltage is 2.75 V, the differential amplifying circuit 18 generates the control voltage of about 1 V, and this control voltage causes the conductivity of the MOS transistor T6 to increase. Then, the voltage drop at the MOS transistor decreases, so that the drain voltage (i.e., output voltage VDD) of the MOS transistor T6 increases due to the reduction in voltage drop. The output voltage VDD is again supplied as the feedback voltage to the differential amplifying circuit 18. As the feedback voltage VDD approaches the reference voltage VR (=3 V), the differential amplifying circuit 18 gently drops the conductivity of the MOS transistor T6. When the feedback voltage reaches a value equal to the reference voltage VR (=3 V), the control voltage of 2.5 V is supplied to the MOS transistor T6 from the differential amplifying circuit 18.

The conductivity of the MOS transistor T6 is controlled by the control voltage which gently varies. This control does not cause the output voltage VDD to increase to a value higher than the reference voltage VR. However, the output voltage VDD could be a value higher than the reference voltage VR due to the influence of, for instance, variation in load. If that happens, the differential amplifying circuit 18 generates a control voltage higher than 2.5 V; however, this control voltage exceeds the threshold voltage of the p-channel MOS transistor T6, so that the MOS transistor T6 becomes non-conductive. Consequently, the output voltage VDD assuredly drops to 3 V due to the charging of the LSI circuit 10.

As described above, in this embodiment, the voltage converting circuit 12 is formed on the same semiconductor chip 14 as that of the LSI circuit 10 and serves to convert the external power source voltage VCC to the output voltage VDD lower than that voltage VCC. In this conversion, the output voltage VDD is set to a value equal to the operating voltage (i.e., reference voltage VR) of the LSI circuit 10. Therefore, no malfunction occurs in the LSI circuit 10. In other words, by adding the voltage converting circuit to the LSI circuit 10, the operating voltage of the MOS transistors in this LSI circuit 10 can be set to a sufficiently low value. Thus, in case of increasing integration of the MOS LSI circuit, the effective channel length of the MOS transistor can be further reduced without deteriorating performance and reliability.

The feedback loop of the voltage converting circuit 12 returns the output voltage VDD to the operating voltage even if the power source voltage VCC or characteristics of the MOS transistors T1 to T6 temporarily change to some extent due to a variation of, for example, temperature or the like. Thus, the output voltage VDD is maintained at a set voltage, and stable electric power can be supplied to the LSI circuit 10.

The points to which attention should be paid concerning the regulation of the output voltage VDD will now be explained. For example, in the case where the output voltage VDD makes a larger drop from the reference voltage VR due to the starting operation of the LSI circuit 10, the conductivity of the MOS transistor T6 has to be set to a high value. In the feedback loop in this embodiment, the conductivity of the MOS transistor gently drops from this high value in accordance with the decrease in voltage difference between the output voltage VDD and the reference voltage VR. Thus, the output voltage VDD is regulated to a value equal to the reference voltage VR without exceeding the reference voltage VR.

In the case where the loop gain of the feedback loop is high, the control voltage rapidly changes. That is, the conductivity of the voltage drop circuit 20 is maintained at a high value during the time when the output voltage VDD is lower than the reference voltage VR. When the output voltage VDD becomes equal to the reference voltage VR, the conductivity of the voltage drop circuit 20 is reduced instantaneously. In this case, the output voltage VDD is easily affected by the time-delay in the feedback loop. For example, when the output voltage VDD increases from the low voltage state to the reference voltage VR, the conductivity of the voltage drop circuit 20 is not reduced by the control voltage. After the delay time during which the output voltage VDD increases to a value exceeding the reference voltage VR, the conductivity of the voltage drop circuit 20 is reduced by the control voltage. Thereafter, the output voltage VDD changes to a value lower than the reference voltage VR due to the charging of the LSI circuit 10; then, it again changes to a value higher than the reference voltage VR. Namely, when the loop gain of the feedback loop is high, this loop serves to perform the oscillating operation as described above. Therefore, it is difficult for the output voltage VDD to be stabilized to a value equal to the reference voltage VR.

In the foregoing embodiment, since the constant voltage generating circuit 16 is used to drive a single MOS transistor in the differential amplifying circuit 18, a large current driving capability is not required. Therefore, the voltage generating circuit is not limited to the circuit shown in FIG. 2, but any other circuit can be used if it can only generate a reference voltage VR which is stable against variation in external power source voltage or temperature.

Further, in the foregoing embodiment, the differential amplifying circuit 18 is of the current mirror type. It may, however, be substituted by a differential amplifying circuit of the non-current mirror type if the change characteristic of the output voltage is gentle.

FIG. 5 shows a voltage converting circuit of a semiconductor device according to another embodiment of the present invention. In the semiconductor device of this embodiment similar parts and components to those shown in the foregoing embodiment are designated by the same reference numerals. In addition, the portions which are not shown in the drawing are the same as those in the foregoing embodiment.

In the embodiment of FIG. 5, the p-channel MOS transistor T6 in FIG. 2 is replaced by an n-channel MOS transistor T7. Further, the reference voltage VR is supplied to the gate of the MOS transistor T3, and the output voltage VDD is supplied as the feedback voltage to the gate of the MOS transistor T4. According to this embodiment, the stable output voltage VDD can be generated similar to the foregoing embodiment. However, in a comparison of the current driving capability of the voltage drop circuit between the n-channel and p-channel MOS transistors under the same conditions, the p-channel MOS voltage drop circuit is superior to the n-channel MOS one.

In the differential amplifying circuits in FIGS. 2 and 5, the p-channel MOS transistors may be replaced by the n-channel MOS transistors, and the n-channel MOS transistors may be replaced by the p-channel MOS transistors, respectively. Further, the polarities of the power source terminals P1 and P2 may be reversed. For instance, the power source terminals P1 and P2 may be set to the potentials of 0 V and 5 V.

What is claimed is:

1. A voltage converting circuit for supplying a suitable voltage to a load circuit on a semiconductor chip comprising:

first and second power source terminals for receiving a power source voltage;

voltage drop means, connected in series with said load circuit between said first and said second power source terminals, for producing said suitable voltage to said load circuit, the resistance value of said voltage drop means being variable by a control voltage;

voltage generating means for generating at an output terminal a constant voltage lower than said power source voltage; and differential amplifying means, connected to receive directly from said voltage generating means said constant voltage as a reference voltage and connected to receive directly from said voltage drop means said suitable voltage as a feedback voltage, for detecting a voltage difference between said reference and feedback voltages and for producing said control voltage from said detected voltage difference to gently change said resistance value of said voltage drop means to reduce said voltage difference and maintain said suitable voltage at said load circuit, said differential amplifying means including a first MOS transistor and a second MOS transistor wherein a gate of said first MOS transistor is connected to a junction between said voltage drop means and said load circuit and a gate of said second MOS transistor is connected to said voltage generating means at said output terminal.

2. A voltage converting circuit according to claim 1 wherein said differential amplifying means is an enhancement CMOS differential amplifying circuit between said first and second power source terminals, and said voltage drop means is an enhancement MOS transistor having a current path connected in series with said load circuit and a gate connected to receive said control voltage from said differential amplifying circuit.

3. A voltage converting circuit according to claim 2 wherein said differential amplifying circuit includes a current mirror load and said differential amplifying circuit has an input/output characteristic in which its output voltage is said control voltage and is linearly generated with respect to said voltage difference at a gentle slope when said voltage difference variations are small to maintain said suitable voltage at said load circuit.

4. A voltage converting circuit according to claim 3 wherein said MOS transistor of said voltage drop means and said differential amplifying circuit are formed so that said MOS transistor of said voltage drop means is turned off by said control voltage generated from said differential amplifying circuit when said feedback voltage is higher than said reference voltage.

5. A voltage converting circuit according to claim 4 wherein said MOS transistor of said voltage drop means is of a p-channel type, and said differential amplifying circuit includes a positive input terminal connected to said output terminal of said voltage generating means and a negative input terminal connected to a junction of said load circuit and a drain of said p-channel MOS transistor of said voltage drop means.

6. A voltage converting circuit according to claim 4 wherein said MOS transistor of said voltage drop means is of an n-channel type, and said differential amplifying circuit includes a negative input terminal connected to said output terminal of said voltage generating means and a positive input terminal connected to a junction of said load circuit and a source of said n-channel MOS transistor of said voltage drop means.

7. A voltage converting circuit according to claim 1, wherein said voltage generating means includes resistive means and a diode series which are connected in series between said first and second power source terminals, said output terminal of said voltage generating means being connected to a junction of said resistive means and said diode series.

8. A voltage converting circuit according to claim 1 wherein said load circuit includes at least one submicron MOS transistor.

9. A voltage converting circuit for supplying a suitable voltage to a load circuit on a semiconductor chip comprising:

first and second power source terminals for receiving a power source voltage;

voltage drop means, connected in series with said load circuit between said first and second power source terminals, for producing said suitable voltage to said load circuit, the resistance value of said voltage drop means being variable by a control voltage;

voltage generating means for generating at an output terminal a constant voltage lower than said power source voltage; and differential amplifying means, connected to receive directly from said voltage generating means said constant voltage as a reference voltage, connected to receive directly from said voltage drop means said suitable voltage as a feedback voltage, and connected to said first and second power source terminals, for detecting a voltage difference between said reference and feedback voltages and for producing said control voltage from said detected voltage difference to gently change said resistance value of said voltage drop means to reduce the voltage difference and maintain said suitable voltage at said load circuit, said differential amplifying means being made operable under said power source voltage.

10. A voltage converting circuit according to claim 9, wherein said differential amplifying means includes a current mirror load a differential pair, and a constant current source which are connected in series between said first and second power source terminals.

11. A voltage converting circuit according to claim 10, wherein said current mirror load has first and second MOS transistors, said differential pair has third and fourth MOS transistors, said voltage drop means has a fifth MOS transistor, a current path of said fifth MOS transistor is connected between said first power source terminal and said load circuit, a gate of said fourth MOS transistor is connected to the output terminal of said voltage generating means, a gate of said third MOS transistor is connected to a junction between the current path of said fifth MOS transistor and load circuit, one end of said constant current source is connected to said second power source terminal, current paths of said first and third MOS transistors are connected in series with each other between said first power source terminal and the other end of said constant current source, current paths of said second and fourth MOS transistors are connected in series with each other between said first power source terminal and said other end of said constant current source, gates of said first and second MOS transistors are connected to the junction between the current paths of said first and third MOS transistors, and a gate of said fifth MOS transistor is connected to the junction between the current paths of said second and fourth MOS transistors.

* * * * *